(12) United States Patent
Basol et al.

(10) Patent No.: US 7,247,558 B2
(45) Date of Patent: Jul. 24, 2007

(54) METHOD AND SYSTEM FOR ELECTROPROCESSING CONDUCTIVE LAYERS

(75) Inventors: Bulent M Basol, Manhattan Beach, CA (US); Homayoun Talieh, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 34 days.

(21) Appl. No.: 11/088,324

(22) Filed: Mar. 23, 2005

(65) Prior Publication Data

US 2006/0121725 A1 Jun. 8, 2006

(51) Int. Cl.
*H01L 21/4763* (2006.01)
*H01L 21/461* (2006.01)

(52) U.S. Cl. .................. 438/633; 438/691; 257/E21.23

(58) Field of Classification Search ................ 438/633, 438/691; 257/E21.23
See application file for complete search history.

(56) References Cited

U.S. PATENT DOCUMENTS

| | | | |
|---|---|---|---|
| 6,176,992 B1 | 1/2001 | Talieh | |
| 6,270,647 B1 | 8/2001 | Graham et al. | |
| 6,319,384 B1 | 11/2001 | Taylor et al. | |
| 6,333,248 B1 | 12/2001 | Kishimoto | |
| 6,346,479 B1 | 2/2002 | Woo et al. | |
| 6,433,402 B1 | 8/2002 | Woo et al. | |
| 6,482,656 B1 | 11/2002 | Lopatin | |
| 6,492,260 B1 | 12/2002 | Kim et al. | |
| 6,548,395 B1 | 4/2003 | Woo et al. | |
| 6,566,259 B1 | 5/2003 | Ding et al. | |
| 6,620,725 B1 | 9/2003 | Shue et al. | |
| 6,709,970 B1 | 3/2004 | Park et al. | |
| 6,750,144 B2 | 6/2004 | Taylor | |
| 6,867,136 B2 | 3/2005 | Basol et al. | |
| 2003/0015435 A1 | 1/2003 | Volodarsky et al. | |
| 2003/0119311 A1 | 6/2003 | Basol et al. | |
| 2003/0160326 A1* | 8/2003 | Uzoh et al. | ................. 257/758 |
| 2003/0166382 A1 | 9/2003 | Ashjaee et al. | |
| 2004/0012090 A1 | 1/2004 | Basol et al. | |

(Continued)

FOREIGN PATENT DOCUMENTS

EP 1167585 1/2002

(Continued)

OTHER PUBLICATIONS

Reid et al., "Factors influencing damascene feature fill using copper PVD and electroplating," *Solid State Technology*, pp. 86-103 (Jul. 2000).

*Primary Examiner*—William M. Brewster
(74) *Attorney, Agent, or Firm*—Knobbe Martens Olson & Bear LLP

(57) ABSTRACT

The invention provides a process for forming a planar copper structure on a wafer surface in a first module and a second module of a system. During the process, a copper layer is formed on the wafer surface by utilizing an electrochemical deposition process in the first module. After the deposition, the wafer is moved to the second module of the system and an electrochemical mechanical polishing process is applied to planarize the copper layer to a predetermined thickness. The first and second modules can be positioned in a cluster tool. The wafer is subsequently processed by selective copper CMP and selective barrier layer CMP, which are conducted in another cluster tool.

22 Claims, 7 Drawing Sheets

U.S. PATENT DOCUMENTS

2004/0248412 A1 * 12/2004 Liu et al. .................... 438/689

FOREIGN PATENT DOCUMENTS

| | | |
|---|---|---|
| JP | 11165253 | 6/1999 |
| JP | 2000208443 | 7/2000 |
| WO | WO 01/32362 | 5/2001 |
| WO | WO 0178135 | 10/2001 |
| WO | WO 03009361 | 1/2003 |

* cited by examiner

METHOD AND SYSTEM FOR ELECTROPROCESSING CONDUCTIVE LAYERS

RELATED APPLICATIONS

This application is related to the following patents and patent applications which are incorporated herein by reference: U.S. patent application Ser. No. 10/663,318, entitled Conductive Structure Fabrication Process Using Novel Layered Structure and Conductive Structure Fabricated Thereby for Use In Multi-Level Metallization, filed Sep. 16, 2003, which is a divisional application of U.S. application Ser. No. 09/642,827, entitled Conductive Structure Fabrication Process Using Novel Layered Structure and Conductive Structure Fabricated Thereby for Use In Multi-Level Metallization, filed Aug. 22, 2000, now abandoned; U.S. application Ser. No. 09/795,687, entitled Integrated System for Processing Semiconductor Wafers, filed Feb. 27, 2001; U.S. application Ser. No. 10/369,118, entitled Integrated System for Processing Semiconductor Wafers, filed Feb. 18, 2003; U.S. application Ser. No. 10/201,604, entitled Multi-Step Electrode position Process For Reducing Defects And Minimizing Film Thickness, filed Jul. 22, 2002; U.S. application Ser No. 10/201,606, entitled Planar Metal Electro Deposition, filed Jul. 22, 2002; U.S. application Ser. No. 10/379,265, entitled Defect Free Thin and Planar Film Deposition, filed Mar. 3, 2003; and U.S. patent application Ser. No. 10/152,793 entitled Pad Designs and Structures for a Versatile Materials Processing Apparatus, filed May 23, 2002, which is a divisional of U.S. application Ser. No. 09/511,278, entitled Method and Apparatus Employing Pad Designs And Structures With Improved Fluid Distribution, filed Feb. 23, 2000 and now U.S. Pat. No. 6,413,388.

FIELD

The present invention generally relates to semiconductor processing technologies and, more particularly, to semiconductor interconnect fabrication processes and systems.

BACKGROUND

Conventional semiconductor devices generally include a semiconductor substrate, usually a silicon substrate, and a plurality of sequentially formed dielectric interlayers, such as silicon dioxide and conductive paths or interconnects formed of conductive materials. Interconnects are usually formed by filling a conductive material in trenches etched into the dielectric interlayers. In an integrated circuit, multiple levels of interconnect networks laterally extend with respect to the substrate surface. Interconnects formed in different layers can be electrically connected using vias or contacts. A metallization process can be used to fill such features, i.e., via openings, trenches, pad openings or contact holes with a conductive material.

Copper and copper alloys have recently received considerable attention as interconnect materials because of their superior electromigration and low resistivity characteristics. The preferred method of copper metallization is electroplating. The electroplating can be done using, for example, a conventional electrochemical deposition (ECD) technique. Standard electrochemical deposition techniques yield copper layers that deposit conformally over large features, such as features with widths larger than about five micrometers. FIG. 1A shows an exemplary substrate 10 having a copper layer 12 that is formed by electrochemical deposition techniques. The copper layer 12 fills small features 14 and the large features 16 in the substrate. Prior to the deposition, the interior of the features and an upper surface 18 of the substrate 10 are lined with a barrier layer 20 and an optional copper seed layer (not shown). During the early stages of the deposition, the small features 14 are quickly filled with copper. However, filling the large feature 16 takes time and, once done, results in an excess copper 22 over the upper surface 18 of the substrate 10. The excess copper 22 exhibits a characteristic surface topography including a bump 24 over the small features 14 and a recess 26 over the large feature 16. The height of such bumps may vary and is a strong function of the chemistry used for electroplating. Use of leveler additives in the plating chemistry formulation typically reduces the size of the bump.

After the deposition, the electroplated substrates are typically transferred to a separate material removal system, such as a CMP system, and the excess copper is planarized to physically isolate the copper within each individual feature, and thereby forming the metallic interconnect structure. In a subsequent planarization step carried out in the same material removal system, the barrier layer on the surface (which is typically conductive) is also removed so that metal-filled features are electrically isolated from each other. As stated before, the excess copper is typically planarized using a chemical mechanical polishing (CMP) process. However, the above described topography of the excess copper causes problems in CMP and introduces defects in the planarized end product, as will be described later.

In a standard CMP process, a three-step removal approach is typically used in a CMP tool having three stations with three different pads and chemistry delivery means. In the first step, which is carried out in the first station within the CMP tool, bulk copper is removed with a chemistry that is optimized for fast removal and good planarization. During this step, most of the copper layer is planarized and removed, leaving behind only about a 100-300 nm (nanometer) thick copper layer. For example, an incoming wafer with electroplated copper, as shown in FIG. 1A, may have an 800-1200 nm thick excess copper layer. During this first step, the bulk of this excess copper is removed, leaving behind a thin layer that is only about 100-300 nm thick. In the second step, which is carried out in the second station of the CMP tool, a chemistry with a lower copper removal rate is typically employed. This chemistry is optimized for good defect performance and selectivity with respect to the barrier film and the dielectric layer. During the third step of the process, the barrier layer at the top surface is removed at a third station on the CMP tool.

As exemplified in FIG. 1B, one common problem observed in this approach is that the first and second steps of the process cannot efficiently planarize the excess copper 22 with the bump 24. As a result, although copper in the large feature 16 is planarized, a residual copper 28 is still left over the dense and small features 14. At this point, if the process is continued to over-polish the copper and remove the residual copper 28 to avoid electrical shorts between the small features 14, the top portion 30 of the copper in the large feature is also removed. Conductive material removal from large features is a defect called "dishing," which reduces the amount of conductive material in an interconnect line and negatively impacts the device performance. There may also be erosion in the dense areas due to this over-polishing step.

The standard interconnect process described above is costly and yields dishing and erosion defects in the interconnect structures, as described above. The overall integration process uses electroplating tools yielding substrates with copper layers, as depicted in FIG. 1A, and CMP tools that receive the substrates with these copper layers and remove the excess copper as described above. The cost of an interconnect fabrication process is mostly in the material removal steps, which are carried out at a material removal tool or station, such as a CMP tool. As the number of interconnect layers increase, the impact of CMP cost and the impact of dishing and erosion defects become more and more important. If, instead of the thick and topographic copper layer shown in FIG. 1A, a thin and flat copper layer could be provided by the plating tool, the CMP process could be greatly simplified, thereby reducing costs and minimizing defects.

From the foregoing, it is clear that there is a need for new processes and systems which provide copper layers so that defects caused during the overburden removal steps are reduced or eliminated and the overall cost is reduced.

SUMMARY

Figure 1A:
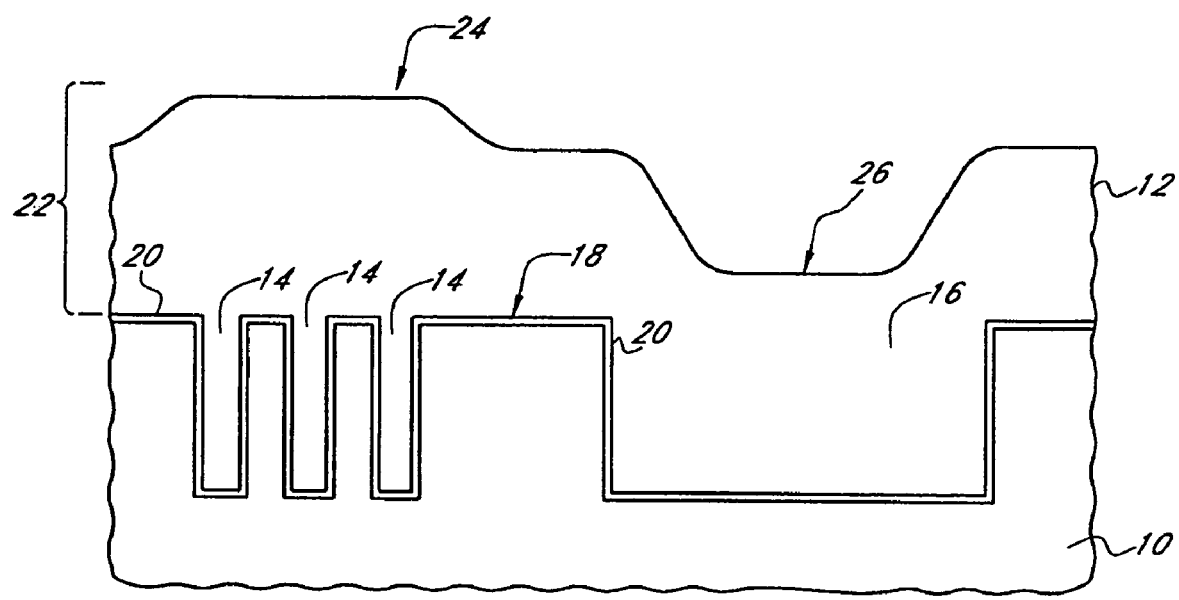
FIG. 1A is a schematic side view of substrate having a conductive layer that has been deposited using electrochemical deposition.
Figure 1B:
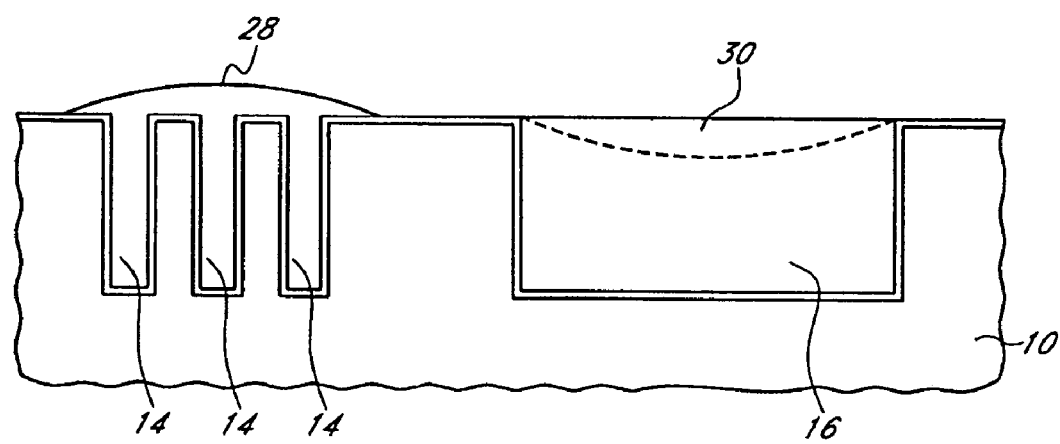
FIG. 1B is a schematic side view of the substrate shown in FIG. 1A wherein the conductive layer has been planarized using prior art techniques.

A process is provided for forming a planar conductive structure on a substrate surface in an electroplating or electrochemical deposition (ECD) module and an electrochemical mechanical polishing (ECMP) module. During the process, in the ECD module, a conductive layer is formed on the substrate surface by utilizing an electrochemical deposition process. After the deposition, the substrate is moved to the ECMP module and an electrochemical mechanical polishing process is applied to planarize the conductive layer.

In one aspect of the present invention, a method of fabricating a planar conductive structure is provided. The conductive structure is formed over a plurality of cavities formed in a surface of a substrate. The surface and the cavities are coated with a conducting film. The method includes performing in a first module an electrochemical deposition process for filling a conductive material into the plurality of cavities until a layer of conductive material is formed over the surface of the substrate; moving the substrate to a second module after performing the electrochemical deposition process; and applying an electrochemical mechanical polishing process in the second module to planarize the layer of conductive material to a predetermined thickness. In one embodiment, both the first and second modules are positioned in a first tool or system. In one embodiment, the substrate is moved from the second module into a separate chemical mechanical polishing (CMP) tool or system.

DETAILED DESCRIPTION

A method and system are described herein to manufacture planar conductor layers on a substrate by first depositing the conductor by electroplating and planarizing the conductor using electrochemical mechanical polishing or etching. In one illustrated embodiment, both electroplating and electrochemical mechanical polishing are conducted in a single system comprising electrochemical deposition (ECD) and electrochemical polishing (ECMP) modules. In another embodiment, separate tools are provided for both ECD and ECMP modules. The preferred embodiments eliminate the need for the chemical mechanical polishing step that follows the electrochemical deposition step and planarizes bulk conductor in the prior art. Removal of the bulk conductor with CMP process is a high-cost and low-throughput process requiring costly slurries.

Exemplary processes and systems may be found in the following patents and patent applications, which are owned by the assignee of the present invention and hereby incorporated herein in their entirety: U.S. Pat. No. 6,413,388, entitled Method and Apparatus Employing Pad Designs And Structures With Improved Fluid Distribution; U.S. patent application Ser. No. 09/642,827, entitled Conductive Structure Fabrication Process Using Novel Layered Structure and Conductive Structure Fabricated Thereby For Use In Multi-Level Metallization, filed Aug. 22, 2000; U.S. application Ser. No. 09/795,687, entitled Integrated System for Processing Semiconductor Wafers, filed Feb. 27, 2001; U.S. application Ser. No. 10/369,118, entitled Integrated System for Processing Semiconductor Wafers, filed Feb. 18, 2003; U.S. application Ser. No. 10/201,604, entitled Multi-Step Electrode Position Process For Reducing Defects And Minimizing Film Thickness, filed Jul. 22, 2002; U.S. application Ser. No. 10/201,606, entitled Planar Metal Electro Deposition, filed Jul. 22, 2002; and U.S. application Ser. No. 10/379,265, entitled Defect Free Thin and Planar Film Deposition, filed Mar. 3, 2003, the disclosures of which are incorporated by reference herein.

Figure 2A:
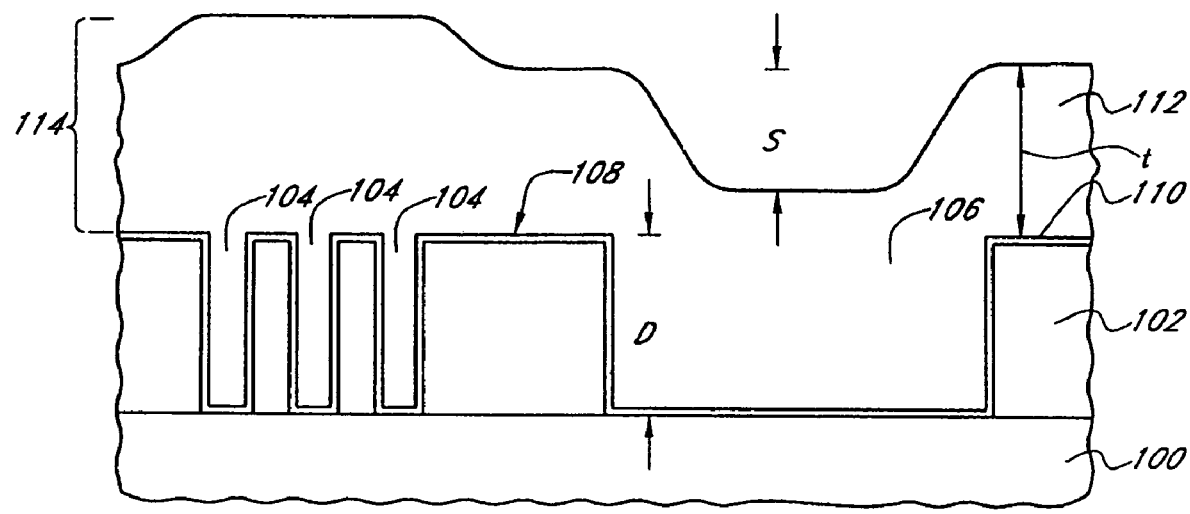
FIG. 2A is a schematic side view of a substrate having a conductive layer that has been deposited in an electrochemical deposition module in accordance with a preferred embodiment of the present invention.
Figure 2B:
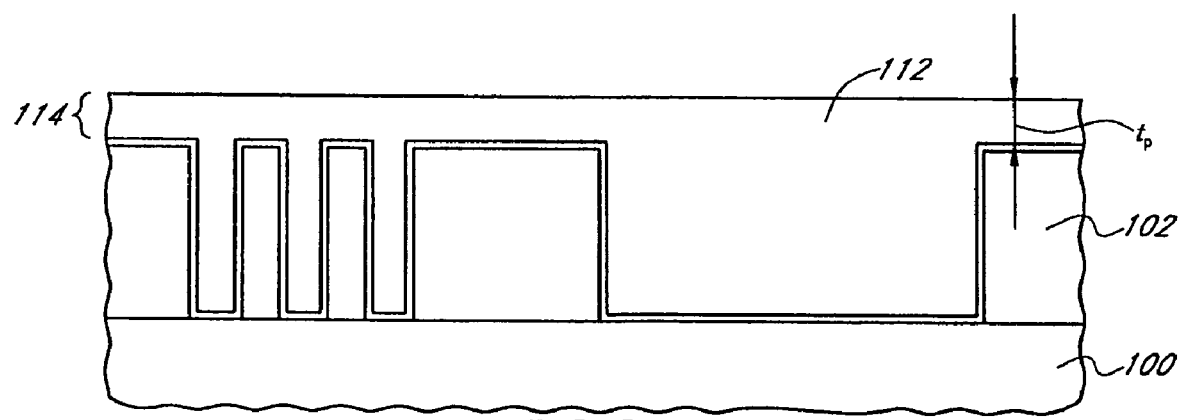
FIG. 2B is a schematic side view of the substrate shown in FIG. 2A wherein the conductive layer has been planarized in an electrochemical mechanical planarization module in accordance with a preferred embodiment of the present invention.
Figure 3:
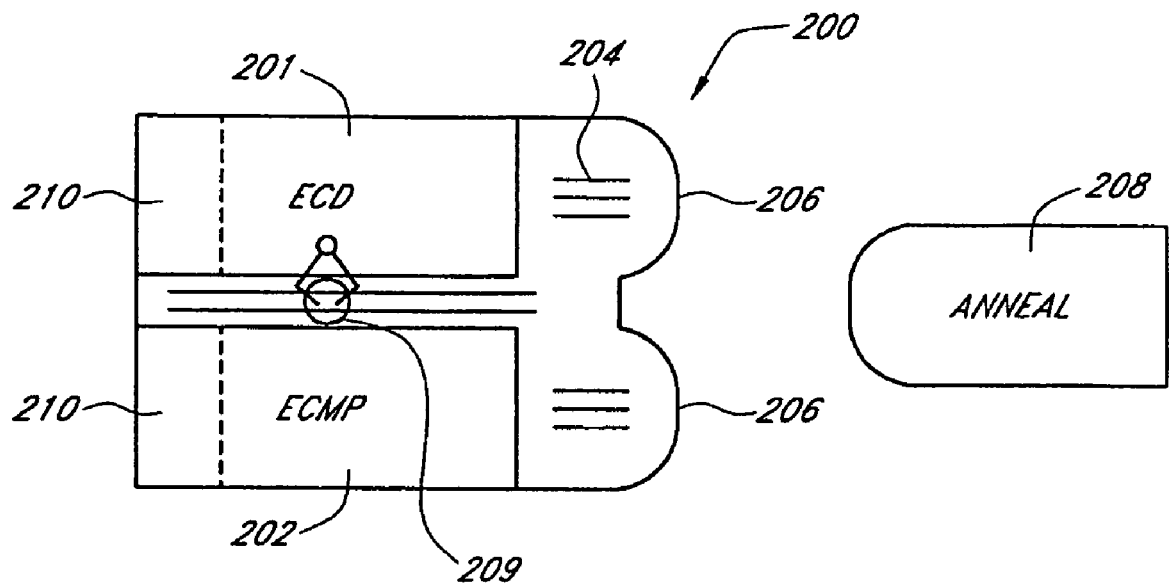
FIG. 3 is a schematic view of a system of a preferred embodiment.

FIGS. 2A and 2B illustrate a workpiece or substrate 100 that is processed using the system 200 shown in FIG. 3. Accordingly, as shown in FIG. 2A, the workpiece 100 may be an exemplary portion of a semiconductor substrate, such as a wafer, and may include front end integrated circuit features, such as transistors. A conductive material, such as copper or copper alloy, or other conductive materials are deposited on the surface, preferably by electroplating. The workpiece 100 includes a dielectric layer 102, which is patterned and etched to form narrow features 104 and wide features 106. Narrow features may be vias and lines with typical widths of 1 micron or less, whereas wide features may have widths of larger than about 4 microns. Features with widths between 1-4 microns may be considered intermediate width features. The depth of the features may be "D". Before the electrochemical deposition, the features 104, 106 and upper surface 108 of the dielectric layer 102 are coated with a barrier layer 110, such as a Ta/TaN layer, and an optional copper seed layer (not shown). A copper layer 112 is deposited using an electrochemical deposition (ECD) process. As described above, electrochemical copper deposition forms an excess copper 114 with a thickness "t" over the upper surface 108. Copper electrodeposits differently in different size features. For example, copper deposits in a bottom-up fashion in the narrow features if there are organic additives such as accelerators and suppressors in the copper electrolyte. This is called super-filling and it means that filling of such narrow features is achieved by depositing a copper layer with a thickness over the insulator surface that is much smaller than the depth "D" of the narrow features. Copper, on the other hand deposits conformally into wide features. In other words, to fill a wide feature one need to deposit a copper layer as thick as the depth of the wide feature. Further, deposition behavior in intermediate width features is in between these two cases. Since there are a wide range of feature widths on a given wafer surface, ranging from sub-micron size to over 50 microns, the thickness of the copper to be deposited is determined by the wide features and it is typically larger than the depth of the large features to assure all features are completely filled with copper.

As discussed above, after electrochemical deposition, the step height S over the wide feature 106 is approximately equal to the depth D of the feature 106; thus, surface of copper layer 112 is non-planar. A depth range for the features may be from about 150 nm to over 4000 nm, depending upon the device design. Following the electrochemical deposition, as shown in FIG. 2B, the workpiece 100 is cleaned or rinsed and dried and the bulk of the excess copper 114 is planarized using an electrochemical mechanical polishing (ECMP) process in the same system shown in FIG. 3. As shown in FIG. 2B, the ECMP process planarizes the copper layer 112 and reduces its thickness "t" to a predetermined thickness "$t_P$" which is less than 300 nm, preferably about 100-300 nm. After the ECMP process the workpiece is again cleaned, rinsed and dried before moving it to another process module for further processing.

The predetermined thickness "$t_P$" of the planarized layer plays a critical role in determining thickness "t" of the deposited copper layer 112 during the prior ECD step. Typically, the electrochemical deposition process deposits the conductive material to a thickness "t" that is at least equal to a sum of the depth D of the wide feature 106 and the predetermined thickness "$t_P$". Accordingly, to obtain the predetermined thickness "$t_P$", the electrochemical mechanical polishing process removes a thickness of the conductive material that is at least equal to the depth D of the feature 106. These relationships hold true if the planarization of the ECMP step is carried out with hundred percent efficiency. In reality ECD step may deposit the conductive material to a thickness "t" which is larger than the sum of $(D+t_P)$ and the ECMP step removes a thickness of the conductive material that is more than D to leave behind a thickness of "$t_P$".

The ECMP process is preferably performed using relatively low cost solutions with no or minimum amount of abrasive particles, such as less then 0.1 weight % of abrasive particles. In comparison to prior art CMP, the ECMP process is a high-throughput and low cost process using less consumables at low down pressure. Because of the low pressures employed (<0.5 psi), pad lifetime in an ECMP process is much longer than in a CMP process. Further details on the process of ECMP and suitable tools therefor are disclosed, for example, in U.S. Pat. No. 6,413,388, entitled Method and Apparatus Employing Pad Designs And Structures With Improved Fluid Distribution, U.S. application Ser. No. 09/795,687, filed Feb. 27, 2001 (NT-202) and U.S. application Ser. No. 10/379,265, filed Mar. 3, 2003 (NT-288), the disclosures of which are incorporated herein by reference.

FIG. 3 illustrates an exemplary system 200 to perform the above-described process. The system 200 may include at least two process modules, namely an ECD module 201 and an ECMP module 202 and in some arrangements may include multiple ECD modules and ECMP modules. The system 200 may be a tool or cluster tool. Accordingly, a wafer 204 to be processed is first delivered to the system 200 in a box 206, such as a standard Front Opening Unified Pod (FOUP). It will be understood that the wafer 204 may include the structure of above described workpiece 100, but, for clarity, it is given a different reference numeral. The wafer 204 is then delivered to the ECD module 201 for electroplating by a robot 209. After the electroplating, the wafer 204 is taken to the ECMP module 202 for planarization. Following this, the wafer may be returned back into the box 206 to be delivered to a material removal station in another tool (see FIGS. 5A-5B) to remove the remaining flat copper and the barrier layer. Optionally, after the electroplating or after the planarization or after the electroplating and planarization, the wafer 204 may be annealed in an anneal station 208 outside the system 200. The system may also include cleaning and rinsing chambers 210, as shown, to clean the wafer after the plating and planarizing process steps. Alternatively, cleaning and rinsing modules are integrated with the process modules in a vertical fashion as described in U.S. Pat. No. 6,352,623 entitled Vertically Configured Chamber Used for Multiple Processes, which is owned by the assignee of the present application, the disclosure of which is incorporated herein by reference.

While only a single robot 209 is shown in FIG. 3, those skilled in the art will readily appreciate that cluster tools such as the exemplary system 200 can have one or more robots. For example, a separate robot with its own end effector can be provided at the front end of the system for loading and unloading wafers 204 to and from boxes 206 such as FOUPs or other wafer cassettes. Regardless of whether a separate front end robot is provided, a single robot will typically access all of the process modules (e.g., ECD module 201, ECMP module 202, cleaning and rinsing chamber 210). Similarly, other embodiments described herein below may include more than the illustrated single robot per system.

Figure 4:
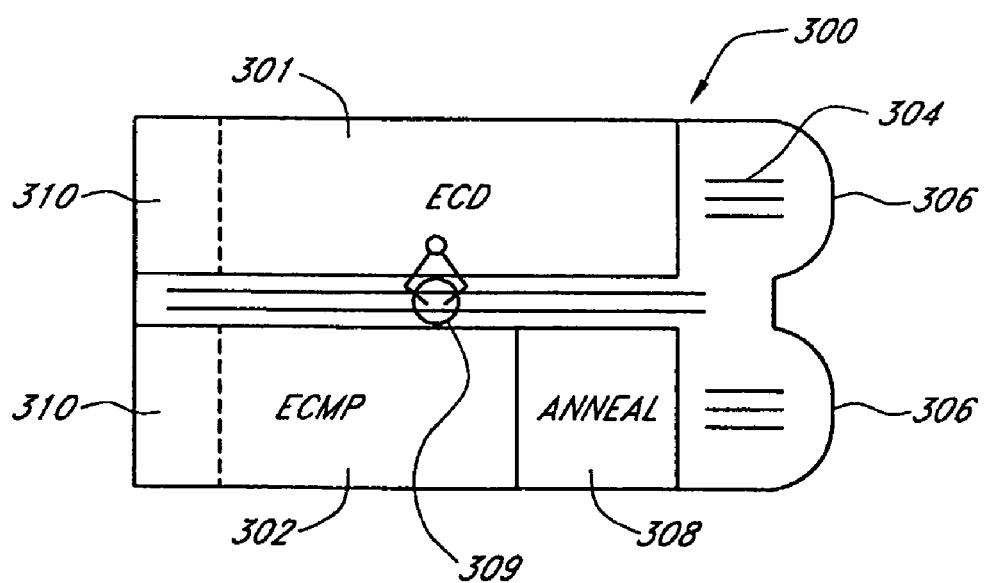
FIG. 4 is a schematic view of a system of another preferred embodiment.

FIG. 4 illustrates an alternative exemplary system 300 to perform the above-described process. The system 300 may be a tool or cluster tool. The system 300 may include at least three process modules, namely an ECD module 301, an ECMP module 302 and an anneal module 303. Accordingly, a wafer 304 to be processed is first delivered to the system 300 in a supply box 306, such as a FOUP. It will be understood that the wafer 304 may include the structure of the above-described substrate 100 but for clarity it is given a different reference numeral. The wafer 304 is then delivered to the ECD module 301 for electroplating by a robot. After the electroplating, the wafer 304 may be annealed in the anneal module 303. After the annealing, the wafer 304 is taken to an ECMP module 302 for planarization. After the planarization the wafer may be annealed one more time. The anneal process is optional and may be performed after both processes, or before or after the planarization process. Following this, the wafer is returned back into the box 306 to be delivered to a material removal module to remove the remaining flat copper and the barrier layer. As in the previous system embodiment, the system 300 may also include cleaning and rinsing chambers 310, as shown, to clean the wafer after the ECD and ECMP process steps. The tools of FIG. 3 or 4 may be used upstream of one or more CMP tools, which may comprise one or multiple CMP modules, as will be better understood from the description below.

Those skilled in the art will recognize that delivering a flat thin copper layer as shown in FIG. 2B from the systems 200 or 300 is very attractive. Such a structure, once received by a material removal system, such as a chemical mechanical polishing (CMP) system, the commonly used bulk copper removal step is skipped. Only the second step and a barrier layer removal step may be carried out, as discussed in more detail with respect to FIG. 5A below. Such removal may be accomplished in two steps using a selective copper slurry and a barrier slurry or in one step using a non-selective slurry that removes both thin Cu and barrier. This reduces the cost of CMP process and increases its throughput. Furthermore, since the copper layer of FIG. 2B is flat, there is little or no bump over the dense and small features and therefore the over-polish is minimized. This results in less dishing and erosion defects in the interconnect structures.

"Flatness" is, of course, relative to the non-flat layer 112 illustrated in FIG. 2A. The step height of the layer 112 may be in the range of 150 to 4000 nm, depending upon the depth D of the features. Accordingly, although FIG. 2B shows a perfectly flat copper layer with zero step height, the copper layer on the wafer prior to entering the CMP tools may have a small step height of less than or equal to 50 nm. Preferably, the step height is less than about 20 nm, which can be achieved even through partial ECMP processing. More preferably, ECMP is allowed to flatten the copper layer to completion, producing a step height of less than or equal to 5 nm. Furthermore the resultant conductor (particularly copper) layer is thin over the top surface of the insulator, preferably 50-500 nm and more preferably 100-300 nm. Accordingly, the subsequent CMP steps can be cost effective and yield better technical results, such as less dishing and erosion.

Figure 5A:
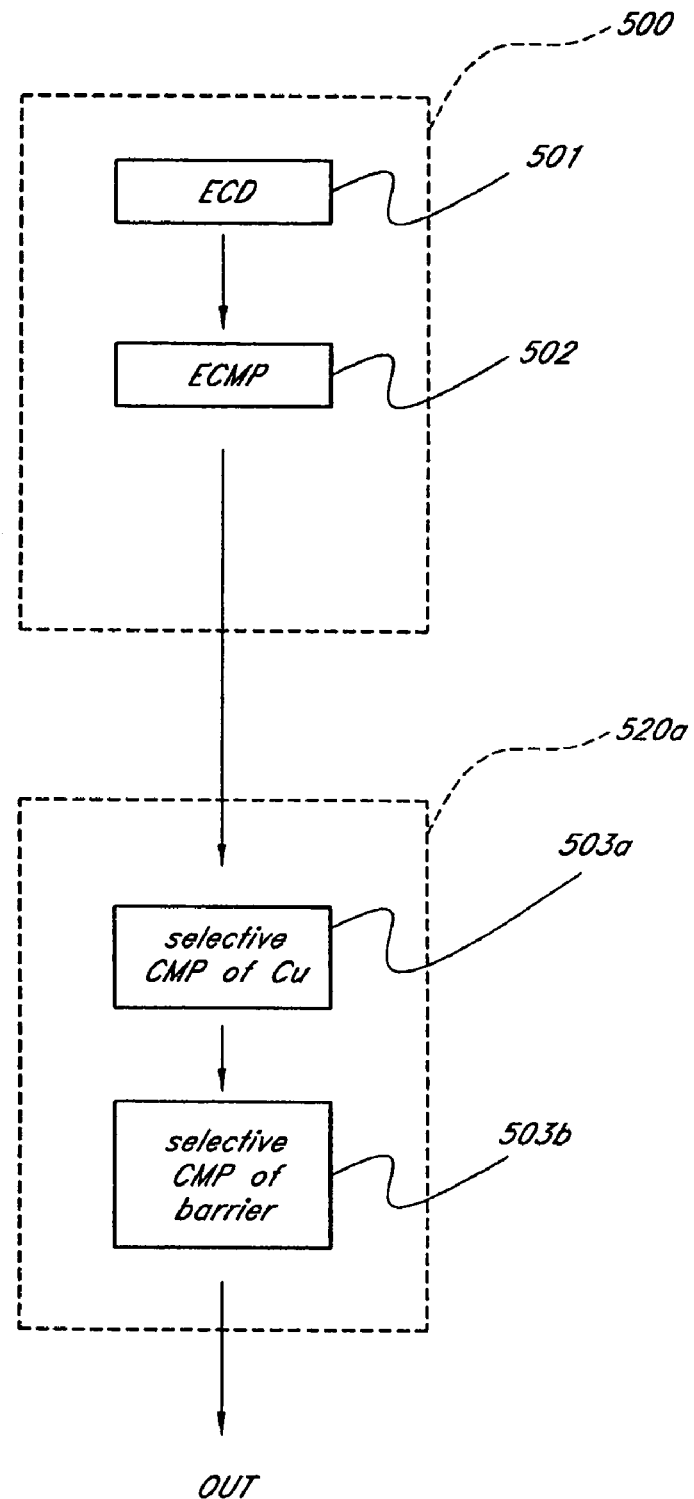
FIG. 5A is a flow chart illustrating movement of the wafer(s) between individual process modules within cluster tools, and from cluster tool to cluster tool, in accordance with a preferred embodiment of the invention.

Referring now to FIG. 5A, the flow chart illustrates the sequence of the preferred process as well as an exemplary cluster tool arrangement in which to practice the preferred process. Namely, the process comprises conducting an ECD process in an ECD module 501, to produce an electroplated copper layer over a wafer having a plurality of features which may have a wide range of widths such as widths from 0.06 μm to 100 μm. The wafer is then transferred to an ECMP module 502 to produce a wafer with a more flat and thin copper surface or to produce a flat copper structure. In the ECMP module, depending on the current density used, an exemplary copper removal rate may be in the range of 100 to 1000 nm/minute. In the illustrated arrangement, both the ECD module 501 and the ECMP module 502 are located in a cluster tool 500; therefore they are integrated within the cluster tool 500.

The wafer with the flat copper layer overlying the insulator is then removed from the ECMP module 502, and in the illustrated arrangement removed from the cluster tool 500. This wafer, preferably with a 100 to 300 nm thickness copper layer over the insulator, is then inserted into a first CMP process station or module 503a, which is configured for selective CMP of copper. As is known in the art, a selective copper CMP is provided with a selective slurry that establishes a higher removal of rate of copper as compared to the underlying barrier material and dielectric. Such a copper CMP slurry typically includes abrasive particles, such as a colloidal silica or filmed silica or alumina; at least one oxidizer, such as hydrogen peroxide or urea hydrogen peroxide; and a complexing agent, such as citric acid, tartaric acid, succinic acid, malonic acid, oxalic acids or amino acids. In addition, a film-forming agent such as BTA is often included to passivate the surface and serve as a corrosion inhibitor. A typical CMP polishing slurry for copper has a pH from about 3.0 to about 9.0. A variety of optional CMP slurry additives, such as surfactants, stabilizers, or dispersing agents, can also be used. Copper can also be polished with a slurry that does not contain abrasive particles. Preferably the copper polishing rate during selective Cu removal is less than 600 nm/minute. Typical removal rates for the copper are in the range from about 100 nm per minute to 500 nm per minute, at a pad pressure of about 1-4 psi. Advantageously, with the chosen slurry composition, the selectivity of the copper removal rate is preferably greater than 5:1 (i.e., copper is removed in that slurry at a rate at least 5 times faster than the barrier material would be removed in that slurry), and more preferably greater than 10:1.

Due to the selective nature of the chosen solution for CMP in the conductor or copper CMP module 503a, the process can preferably be stopped when the barrier material is exposed. Advantageously, the process is relatively short due to the thin and flat copper layer left by the ECMP module 502. Furthermore, since copper layer is thin, a lower pressure CMP process may be used, such as at a pressure of 0.5-2 psi, without paying a large penalty in throughput. This is very important for processing wafers employing ultra low-k dielectric materials which are fragile and cannot be processed at high pressures. Use of thin flat Cu coming from the cluster tool 500 of the present invention enables processing of ultra low-k wafers in the removal system or CMP cluster tool 520a at low pressures at economic throughput levels since the first bulk Cu removal step of the conventional Cu CMP approach is eliminated in the present approach.

Subsequently, the wafer is removed from the copper CMP module 503a and inserted into a second or barrier CMP process station or module 503b. In the illustrated embodiment, the second CMP module 503b is in a CMP cluster tool 520a, along with the first CMP module 503a. This time, the barrier layer removal process is preferably selective for removing the barrier material (e.g., Ta, TaN, W, WN, etc.) selectively relative to exposed copper in the features and the dielectric below the barrier material. Preferably, the selectivity ratio is greater than about 4. However, the selectivity is greater with respect to the copper than it is with respect to the dielectric, to ensure some minimal polishing or removal of the dielectric while minimizing dishing of the copper. An exemplary barrier material removal rate for 1-2 psi of pad pressure is about 20-50 nm per minute. After at least one or more of the ECD, ECMP and copper CMP steps, preferably an annealing step may be performed to stabilize the copper film.

Figure 5B:
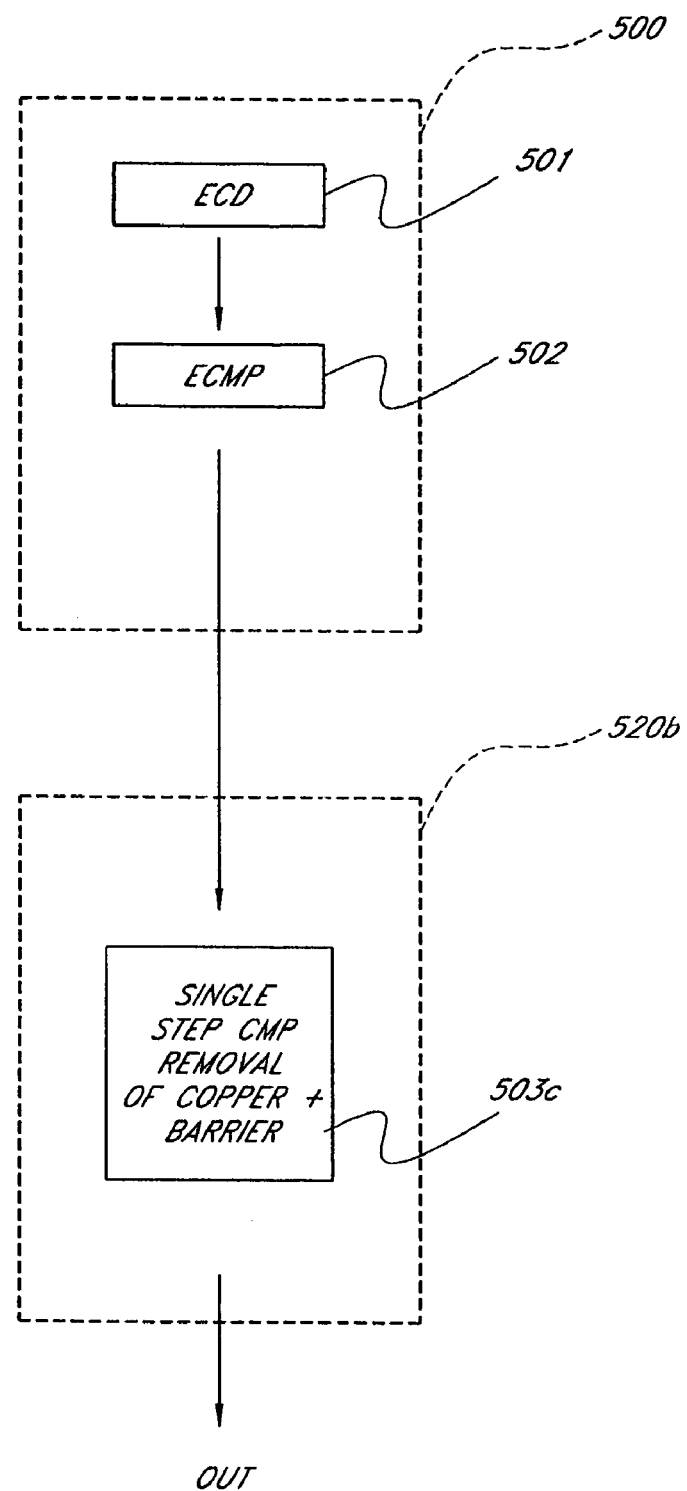
FIG. 5B is a flow chart illustrating movement of the wafer(s) between individual process modules within cluster tools, and from cluster tool to cluster tool, in accordance with another embodiment of the invention.

Alternatively, as shown in FIG. 5B, the ECD/ECMP cluster tool 500 shown in FIG. 2A may be used in conjunction with another CMP tool 520b including a single step CMP module 503c. The single step CMP module 503c is capable of removing the copper layer and the barrier layer using a single CMP process step, resulting in a planarized dielectric layer with planarized copper left only in the cavities. This process may be performed using non-selective slurries with comparable removal rates for copper, barrier material and the dielectric. For example, the copper removal rate may be 50-200 nm/minute, the barrier layer removal rate may be 50-100 nm/minute and the dielectric removal rate may be 10-100 nm/minute. Similar to the previous embodiment, an anneal step may be performed after one or more of ECD, ECMP and copper-barrier layer removal steps. It should be noted that the planarization and thinning of plated copper layers can be performed in a cluster tool by integrating the electroplating and the electrochemical mechanical polishing process modules within that cluster tool. This way the bulk copper removal and planarization step which is traditionally carried out as the first step in a CMP cluster tool, after the copper layer is deposited in a plating tool, is eliminated and the CMP process is simplified to a 2-step process (using selective chemistries) or a 1-step process (using non-selective chemistries).

Figure 6:
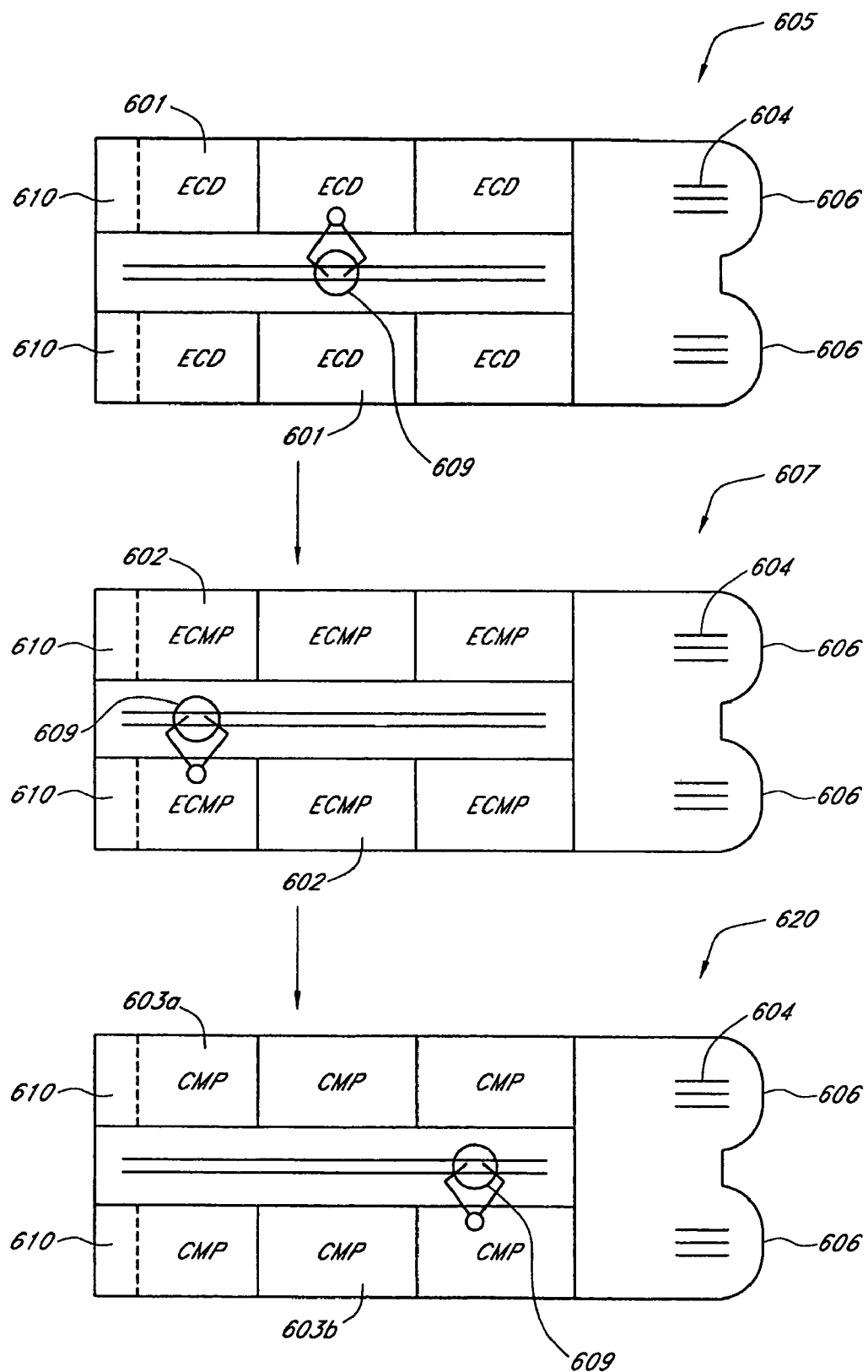
FIG. 6 is a schematic view of a system of another preferred embodiment.

With reference now to FIG. 6, the ECD, ECMP, and CMP processes can be conducted in the sequence disclosed hereinabove without employing the cluster tool arrangements described above. For example, FIG. 6 illustrates three different process modules within three different tools for each of the ECD, ECMP, and CMP processes. For example, one or more ECD process modules 601 can be found in one process tool 605 which may be a cluster tool performing only ECD. While a cluster tool 605 with multiple process modules is illustrated, module 601 can be standalone as well. One or more ECMP process modules 602 are found on another process tool 607 or a cluster tool, and one or more CMP process modules 603 are positioned in yet another process tool 620 or cluster tool. While not shown, two separate CMP process tools can also be provided, one for copper CMP and one for barrier CMP. In the illustrated embodiment, two different types of CMP process modules, one 603a for Cu removal the other 603b for barrier removal, are integrated in the same CMP process tool 620. In this case also, great benefits have been found from using the ECMP process intermediate to the ECD process and the CMP process(es). Namely, the presence of a thin, flat copper film prior to any application of CMP greatly improves the throughput of the CMP, and also improves the technical results, i.e., enables less dishing, erosion and tighter within-die and within-wafer sheet resistance distribution.

Thus, in the illustrated embodiment, the process tool 607 includes a plurality of polishing modules, but each of the polishing modules comprises an electrochemical mechanical polishing (ECMP) module 602. In addition to the polishing modules, the ECMP tool 607 also includes cleaning and rinsing chambers 610 and a docking port for docking supply boxes 606, such as FOUPs or other cassettes. At least one robot 609 is provided for distributing wafers between the docking port and the ECMP modules 602. The illustrated cluster tools 605, 620 also include these components.

Figure 7:
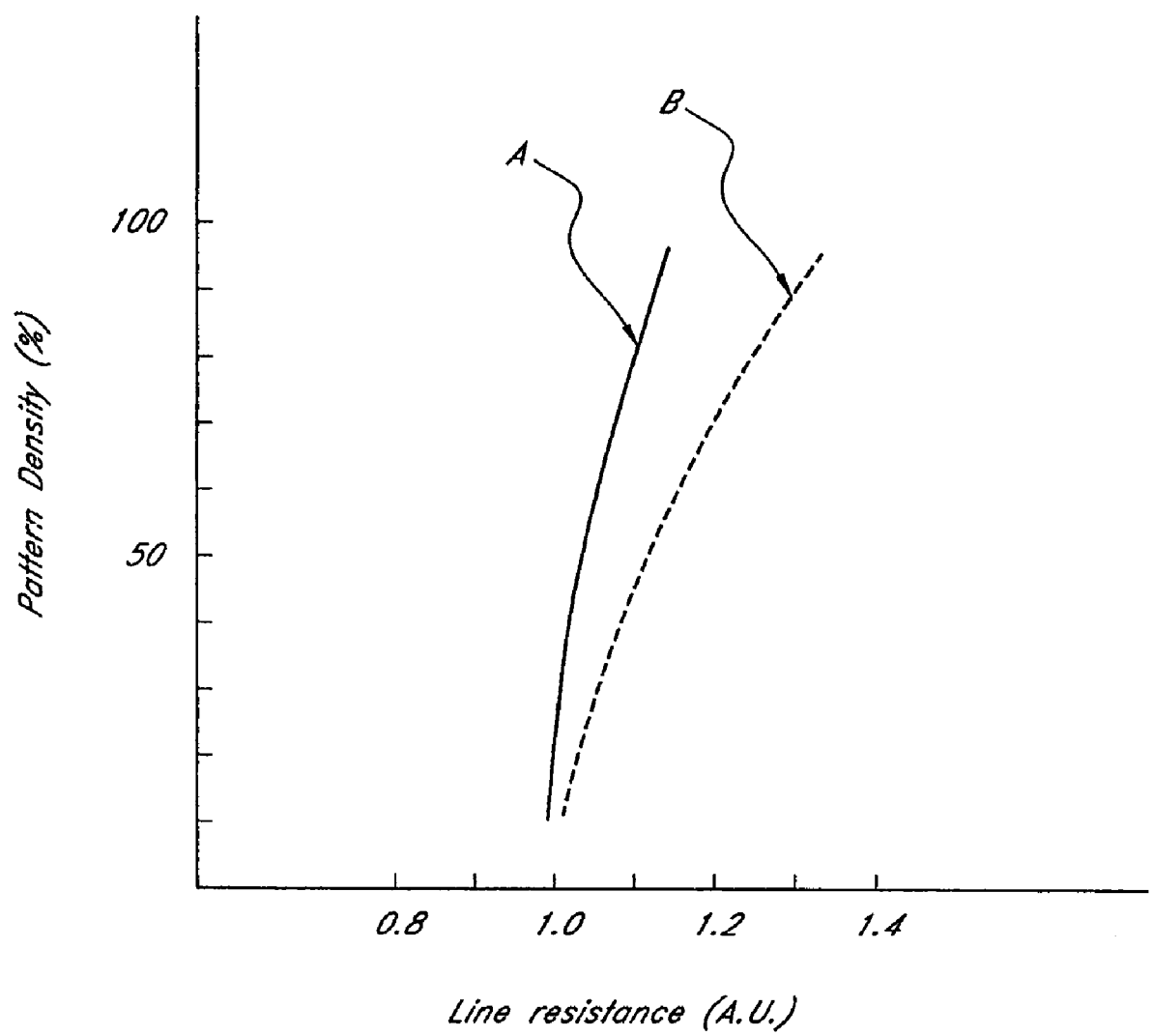
FIG. 7 is a graph comparing experimental line resistance values, as a function of feature density, obtained from wafers processed by methods of the preferred embodiments and the prior art.

The graph in FIG. 7 shows line resistance values as a function of pattern or feature densities, obtained from two wafers after the CMP process step. Measurements were made using long serpentine copper structures formed in the cavities of the wafers. Curve A represents a 200 nm thick flat copper obtained by first depositing a copper layer over the wafer in an ECD process module and then polishing and planarizing it to the predetermined thickness of 200 nm in an ECMP process module. Curve B represents a standard 1 micron thick copper layer deposited in an ECD process module. Both copper layers were processed in a CMP tool where excess copper and barrier layers were removed, leaving them only in the cavities of the serpentine structures. The vertical axis shows the density of features or the serpentine structures. As can be seen from this data, the resistance values obtained from the thin, flat copper layers (curve A) are lower than the resistance values obtained from the wafer with thick non-flat copper (curve B). Furthermore, there is less sensitivity of resistance to changing pattern density for the case of thin flat copper. This data is a good indication of less dishing and erosion in wafers that are processed in accordance with the preferred sequence, and lower resistance values with tighter distribution are important for good yields and device performance. Furthermore, the present approach enables CMP of ultra low-k dielectric materials at low force with high throughput as discussed above.

Throughput improvement can be seen in the following example, comparing CMP or removal of a standard 1000 nm thick post-ECD layer with a 200 nm thick, flat, post-ECMP layer of the preferred embodiments. In the removal of the 1000 nm thick film, in the first stage, 800 nm copper of the 1000 nm copper is removed using CMP with a removal rate of 600 nm/minute. This is the bulk Cu removal and planarization step of the prior art approach. Removal of 800 nm copper is completed within 1.3 minutes. In the second stage, the remaining 200 nm of the copper is removed using a removal rate of about 300 nm/minute, which lasts 0.66 minutes. Then a 30% overpolish time of about 0.39 minute is used to totally clear the copper from over the insulator. An approximately 15 nm thick barrier layer is then removed within 1 minute. Total time for this prior art process sequence is about 3.35 minutes.

With the ECMP planarized 200 nm layer, again, it may take 0.66 minute to remove the 200 nm thick copper. However, in this case a 30% overpolish time is 30% of 0.66 minutes, or about 0.19 minute. With a 1 minute barrier layer removal time, the total process time comes to about 1.85 minute, resulting in a throughput that is about 45% higher than the prior art process. Fast processing also reduces the cost of consumables used in the Cu CMP steps, with attendant economic benefit.

As discussed above, while a single robot 609 is illustrated for each of the cluster tools, it will be understood that separate robots can be provided for front end and back end operations within the cluster tool. In use, batches of wafers can be simultaneously processed in the ECD tool, transferred to the ECMP tool for flattening and thinning the copper layer, and then the batch can then be transferred with flat, thin copper layers to the separate CMP tool for a rapid and uniform CMP removal of the remaining thin copper layer (e.g., 100-300 nm) and removal of the barrier layer. It should be understood that well-known edge copper removal steps or edge bevel removal (EBR) steps may be carried out during the process steps before annealing described above. It is well known that the edge and bevel of the wafer should be cleared off copper before annealing so that copper does not diffuse into the areas where active devices are during the anneal step.

Although various preferred embodiments have been described in detail above, those skilled in the art will readily appreciate that many modifications of the exemplary embodiment are possible without materially departing from the novel teachings and advantages of this invention.

We claim:

1. A method of fabricating a planar conductive structure over a plurality of cavities with a depth formed in a surface of a substrate, wherein the surface and the cavities are coated with a conductive film, the method comprising the steps of:

performing in a first module of a tool an electrochemical deposition process until a conductive material is filled into the plurality of cavities, the conductive material forming a layer over the surface of the substrate;

moving the substrate to a second module of the tool after performing the electrochemical deposition process;

applying an electrochemical mechanical polishing process in the second module to planarize the layer of the conductive material to form a planar conductive structure with a non-zero predetermined thickness over the surface of the substrate; and removing the substrate having the planar conductive structure with the non-zero predetermined thickness from the tool after applying the electrochemical mechanical polishing process.

2. The method of claim 1, wherein the electrochemical deposition process deposits the conductive material to a thickness that is at least equal to a sum of the depth of the plurality of cavities and the predetermined thickness.

3. The method of claim 2, wherein the plurality of cavities comprise cavities with widths larger than 4 microns.

4. The method of claim 2, wherein the electrochemical mechanical polishing process removes a thickness of the conductive material that is at least equal to the depth of the plurality of cavities.

5. The method of claim 1, further comprising cleaning the substrate prior to the step of moving and subsequent to the step of applying.

6. The method of claim 1, further comprising performing an anneal step for annealing the conductive material prior to applying the electrochemical mechanical polishing process.

7. The method of claim 1, further comprising performing an anneal step for annealing the conductive material prior to applying the electrochemical mechanical polishing process and then subsequent to applying the electrochemical mechanical polishing process.

8. The method of claim 1, further comprising performing an anneal step for annealing the conductive material subsequent to applying the electrochemical mechanical polishing.

9. The method of claim 1, wherein the predetermined thickness is less than 300 nm.

10. The method of claim 1, wherein the layer of conductive material has a step height of less than 50 nm after applying the electrochemical mechanical polishing process.

11. The method of claim 10, wherein the step height is less than about 20 nm.

12. The method of claim 11, wherein the step height is less than about 5 nm.

13. The method of claim 1, wherein the predetermined thickness is 100-300 nm.

14. The method of claim 1 further comprising moving the substrate having the planar conductive structure with the non-zero predetermined thickness into a second tool separate after removing the substrate from the tool.

15. The method of claim 14, wherein moving moves the substrate into a chemical mechanical polishing module of the second tool.

16. The method of claim 15, further comprising polishing the planar conductive structure in the chemical mechanical polishing module until exposing an underlying baffler layer.

17. The method of claim 16, further comprising moving the substrate from the chemical mechanical polishing module into a second chemical mechanical polishing module of the second tool.

18. The method of claim 17, further comprising polishing the underlying barrier layer and some of an underlying insulating layer in the second chemical mechanical polishing module.

19. The method of claim 18, further comprising annealing the substrate subsequent to polishing the underlying barrier layer.

20. The method of claim 15, further comprising polishing the planar conductive structure, an underlying barrier layer and an underlying insulating layer in the chemical mechanical polishing module.

21. The method of claim 20, further comprising annealing the substrate prior to moving into the chemical mechanical polishing module.

22. The method of claim 14, further comprising annealing the substrate prior to moving into the second tool.

* * * * *

UNITED STATES PATENT AND TRADEMARK OFFICE
CERTIFICATE OF CORRECTION

PATENT NO. : 7,247,558 B2
APPLICATION NO. : 11/088324
DATED : July 24, 2007
INVENTOR(S) : Bulent M. Basol et al.

It is certified that error appears in the above-identified patent and that said Letters Patent is hereby corrected as shown below:

At Column 8, Line 7, delete "filmed" and insert --fumed--, therefor.

At Column 12, Line 19, in Claim 16, delete "baffler" and insert --barrier--, therefor.

Signed and Sealed this

Twenty-second Day of June, 2010

David J. Kappos
*Director of the United States Patent and Trademark Office*